(12) United States Patent
Kim et al.

(10) Patent No.: US 7,508,469 B2
(45) Date of Patent: Mar. 24, 2009

(54) LIQUID CRYSTAL DISPLAY AND METHOD OF MANUFACTURING THE SAME

(75) Inventors: Sang Ho Kim, Gyeongsangbuk-do (KR); Jin Hwan Kim, Gyeongsangbuk-do (KR); Dae Hyun Jang, Daejeon (KR)

(73) Assignee: LG. Display Co., Ltd., Seoul (KR)

( * ) Notice: Subject to any disclaimer, the term of this patent is extended or adjusted under 35 U.S.C. 154(b) by 119 days.

(21) Appl. No.: 11/823,195

(22) Filed: Jun. 26, 2007

(65) Prior Publication Data

US 2008/0049157 A1    Feb. 28, 2008

(30) Foreign Application Priority Data

Jun. 30, 2006    (KR) .................. 10-2006-0061060

(51) Int. Cl.
*G02F 1/1335* (2006.01)

(52) U.S. Cl. ...................... 349/113; 349/114
(58) Field of Classification Search ............... 349/113, 349/114

See application file for complete search history.

(56) References Cited

U.S. PATENT DOCUMENTS

| | | | |
|---|---|---|---|
| 7,220,625 B2 * | 5/2007 | Yamaguchi et al. | 438/149 |
| 7,463,321 B2 * | 12/2008 | Song et al. | 349/129 |
| 2001/0052952 A1 * | 12/2001 | Choo et al. | 349/43 |
| 2003/0133059 A1 * | 7/2003 | Wei et al. | 349/113 |
| 2004/0183967 A1 * | 9/2004 | Kim et al. | 349/113 |
| 2005/0030451 A1 * | 2/2005 | Liu | 349/113 |
| 2007/0019137 A1 * | 1/2007 | Kim et al. | 349/114 |
| 2007/0103622 A1 * | 5/2007 | Jang et al. | 349/113 |
| 2008/0136988 A1 * | 6/2008 | Yang et al. | 349/43 |

* cited by examiner

*Primary Examiner*—Frank G Font
*Assistant Examiner*—Eric Wong
(74) *Attorney, Agent, or Firm*—Brinks Hofer Gilson & Lione

(57) ABSTRACT

A crystal liquid display and a method of manufacturing the same are disclosed. The liquid crystal display includes upper and lower substrates facing each other, a thin film transistor, a pixel electrode, and a passivation layer. The thin film transistor is provided at an intersection of a gate line and a data line on the lower substrate, and the gate line and the data line cross at right angles. The pixel electrode is provided in a pixel area defined by the gate line and the data line. The passivation layer covers the entire surface of the lower substrate, and includes an opening having an elevation difference surface on a predetermined portion thereof. A concave-convex pattern is provided along the elevation difference surface of the opening.

20 Claims, 5 Drawing Sheets

LIQUID CRYSTAL DISPLAY AND METHOD OF MANUFACTURING THE SAME

This application claims the benefit of Korean Patent Application No. 10-2006-0061060, filed in Korea on Jun. 30, 2006, which is hereby incorporated by reference.

BACKGROUND

1. Field

This document relates to a display apparatus, and more particularly, to a crystal liquid display and a method of manufacturing the same.

2. Description of the Related Art

In liquid crystal displays, a liquid crystal layer having an anisotropic dielectric constant characteristic is formed between a color filter substrate and an array substrate. When an electric field is applied to a liquid crystal material, molecular arrangement of the liquid crystal material changes by the intensity of an electric field to transmit light through the color filer substrate. An amount of light transmitted through the color filter substrate is controlled, thereby displaying a desired image.

The liquid crystal display including a thin film transistor-liquid crystal display (TFT-LCD) generally uses a thin film transistor as a switching device. The liquid crystal displays are classified into an in-plane switching (IPS) mode liquid crystal display and a twisted nematic (TN) mode liquid crystal display depending on a direction of an electric field for driving a liquid crystal. In the IPS mode liquid crystal display, an electric field is applied in a horizontal direction. In the TN mode liquid crystal display, an electric field is applied in a vertical direction.

The liquid crystal display is manufactured through a deposition process, a photolithography process, an etching process, and the like. The photolithography process includes a coating process of a photoresist film, an exposure process, a development process, and an etching process.

In particular, the array substrate being a lower substrate of the liquid crystal display is formed by depositing a thin film and performing a photolithography process using a mask several times. Therefore, there occurs a critical dimension (CD) variation during the photolithography process. Due to the CD variation, stains frequently appear on the array substrate.

The stains cause a CD variation between a pixel electrode and a common electrode. The CD variation between the electrodes causes a field difference between the pixel electrode and the common electrode, thereby causing non-uniformity of a luminance of the liquid crystal display.

SUMMARY

In one aspect, a liquid crystal display comprises upper and lower substrates that face each other, a thin film transistor provided at an intersection of a gate line and a data line on the lower substrate, the gate line and the data line crossing at right angles, a pixel electrode provided in a pixel area defined by the gate line and the data line, and a passivation layer that covers the entire surface of the lower substrate and includes an opening having an elevation difference surface on a predetermined portion thereof, a concave-convex pattern being provided along the elevation difference surface of the opening.

The concave-convex pattern may have one of semicircle, trapezoid, rectangular, and triangle shapes.

The liquid crystal display may further comprise a barrier in the center of the opening.

The barrier may have an elevation difference surface with one of semicircle, trapezoid, rectangular, and triangle shapes.

The opening may have an elevation difference of about 2.0-2.3 μm.

The predetermined portion where the opening is formed may be an area for the contact of the thin film transistor and the pixel electrode.

The predetermined portion where the opening is formed may be a formation area of a sealant used to assemble the upper substrate and the upper substrate.

The predetermined portion where the opening is formed may be a gate pad area connected to the gate line and a gate driving circuit.

The predetermined portion where the opening is formed may be a data pad area connected to the data line and a data driving circuit.

The thin film transistor may comprise a gate electrode divided from the gate line, a gate insulating layer positioned on a front surface including the gate electrode, a semiconductor layer positioned on an upper portion of the gate insulating layer corresponding to the gate electrode, and a source electrode and a drain electrode that are space apart from each other with the semiconductor layer therebetween.

In another aspect, a method of manufacturing a liquid crystal display comprises forming a gate line and a data line on a lower substrate so that the gate line and the data line cross each other, and forming a thin film transistor at an intersection of the gate line and the data line, depositing a passivation layer on the entire surface of the thin film transistor, patterning the passivation layer to form an opening having an elevation difference surface on a predetermined portion of the passivation layer and to form a concave-convex pattern along the elevation difference surface of the opening.

After forming the concave-convex pattern, the method may further comprise depositing a pixel electrode on the passivation layer, coating photoresist on the pixel electrode, and patterning the pixel electrode using the photoresist as a mask to form the pixel electrode in a pixel area.

The opening may have an elevation difference of about 2.0-2.3 μm.

The concave-convex pattern may have one of semicircle, trapezoid, rectangular, and triangle shapes.

The method may further comprise a barrier in the center of the opening.

The predetermined portion where the opening is formed may be an area for the contact of the thin film transistor and the pixel electrode.

The predetermined portion where the opening is formed may be a formation area of a sealant used to assemble an upper substrate and the upper substrate.

The predetermined portion where the opening is formed may be a gate pad area connected to the gate line and a gate driving circuit.

The predetermined portion where the opening is formed may be a data pad area connected to the data line and a data driving circuit.

Coating the photoresist on the pixel electrode may comprise dropping the photoresist on the pixel electrode, and coating the photoresist along a pattern of the passivation layer using a spin coating method.

BRIEF DESCRIPTION OF THE DRAWINGS

The accompany drawings, which are included to provide a further understanding of the invention and are incorporated on and constitute a part of this specification illustrate embodiments of the invention and together with the description serve to explain the principles of the invention. In the drawings.

DETAILED DESCRIPTION OF PREFERRED EMBODIMENTS

Reference will now be made in detail embodiments of the invention examples of which are illustrated in the accompanying drawings.

An explanation will be given of an example of an in-plane switching (IPS) mode liquid crystal display in an embodiment.

Figure 1:
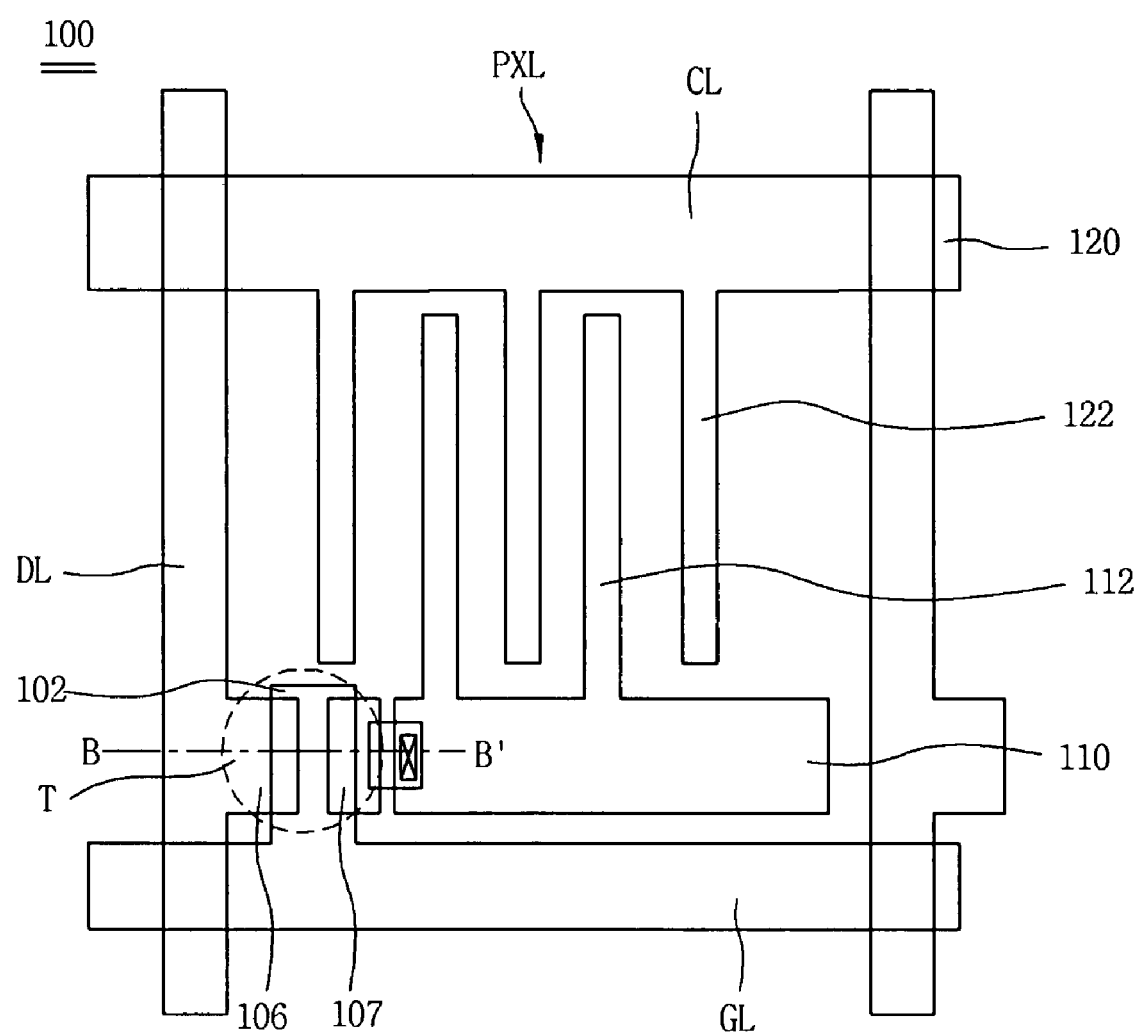
FIG. 1 is a plane view of an array substrate of a liquid crystal display according to an embodiment.
Figure 2:
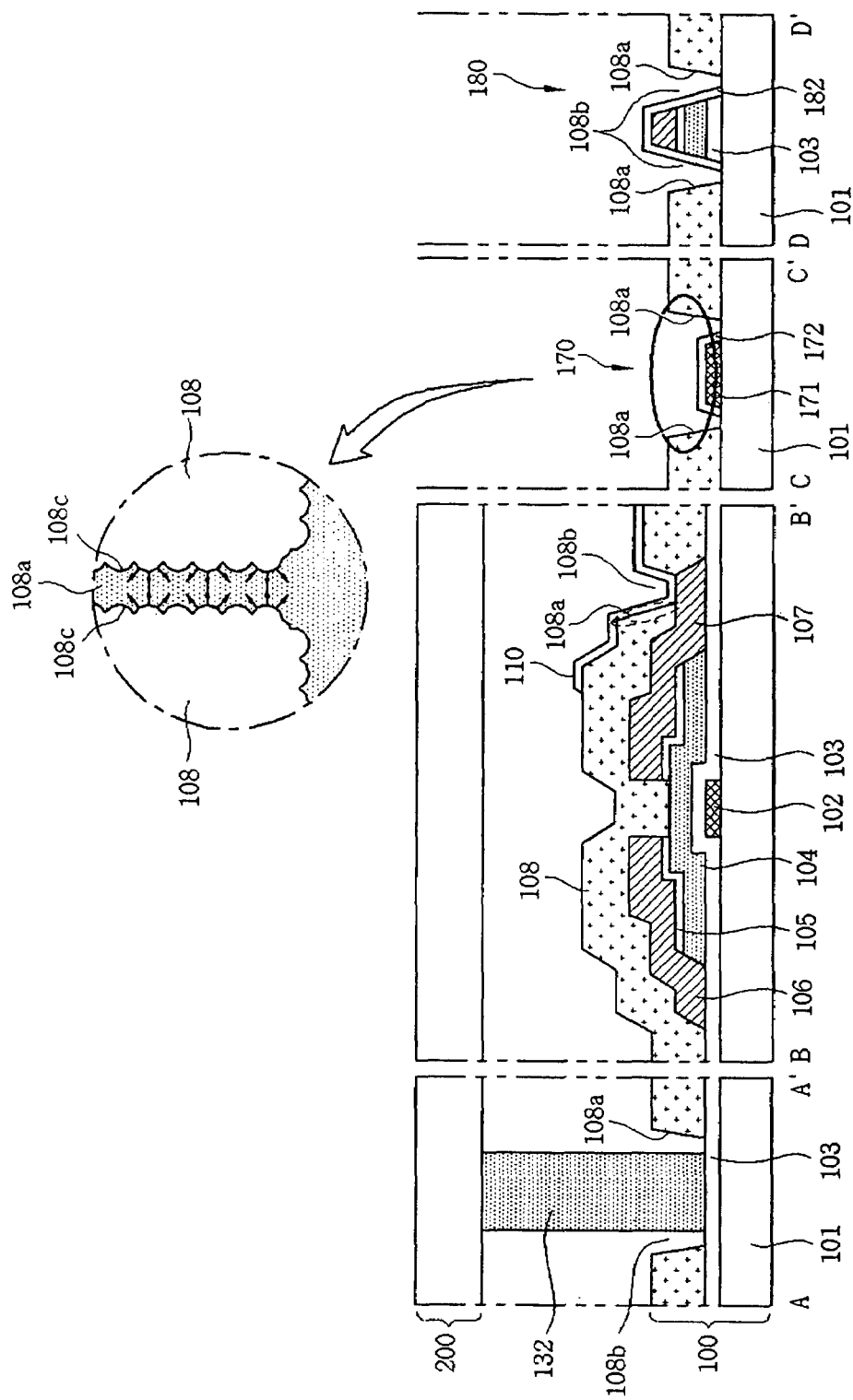
FIG. 2 is cross-sectional views of a sealant formation area A-A', a thin film transistor formation area B-B', a gate pad formation area C-C', and a data pad formation area D-D' in an array substrate of a liquid crystal display according to an embodiment.

FIG. 1 is a plane view of an array substrate of a liquid crystal display according to an embodiment. FIG. 2 is cross-sectional views of a sealant formation area A-A', a thin film transistor formation area B-B', a gate pad area C-C', and a data pad area D-D' in an array substrate of a liquid crystal display according to an embodiment.

Referring to FIG. 1, an array substrate 100 of a liquid crystal display according to an embodiment includes a plurality of gate lines GL, a plurality of common lines 120, and a plurality of data lines DL. The gate lines GL are arranged in parallel in one direction with a predetermined distance therebetween. The common lines 120 are arranged in parallel in one direction to be close to the gate lines GL. The data lines DL cross the gate lines GL to define a pixel area PXL.

A thin film transistor T functioning as a switching device is formed at each of intersections of the gate lines GL and the data lines DL. In each pixel area PXL, a pixel electrode 112 and a common electrode 122 are alternately formed. The pixel electrode 112 generates a horizontal electric field, and the common electrode 122 is connected to a common line 120.

The common line 120 is formed in parallel to the gate line GL with the pixel area PXL therebetween.

In the thin film transistor formation area B-B' of FIG. 2, the thin film transistor T includes a gate electrode 102 divided from the gate line GL, a gate insulating layer 103 formed on the gate electrode 102, an active layer 104, an ohmic contact layer 105, a source electrode 106 and a drain electrode 107, that are spaced apart from each other on ohmic contact layer 105 with the active layer 104 therebetween, and a passivation layer 108.

The source electrode 106 contacting the ohmic contact layer 105 is connected to the data line DL. The drain electrode 107 contacting the ohmic contact layer 105 is connected to a pixel line 110.

The passivation layer 108 covers the entire surface of the array substrate 100. An opening 108b is provided in an area for the contact of the drain electrode 107 and the pixel line 110 to expose the drain electrode 107.

In the formation area A-A' (refer to FIG. 2) of a sealant 132 used to assemble the array substrate 100 and a color filter substrate 200, the passivation layer 108 is formed on a substrate 101 and includes the opening 108b having an elevation difference surface 108a provided at a sealant formation position.

In the gate pad formation area C-C' of FIG. 2, a plurality of gate pads 170 each includes a gate pad lower electrode 171 formed on the substrate 101 and a gate pad upper electrode 172 formed on the gate pad lower electrode 171. The gate pad lower electrode 171 is protruded from the gate line GL.

The passivation layer 108 covers the entire surface of the array substrate 100. The opening 108b having the elevation difference surface 108a is formed in the passivation layer 108 by opening the gate pads 170.

In the data pad formation area D-D' of FIG. 2, a plurality of data pads 180 are formed by simultaneously etching the gate insulating layer 103, the active layer 104, the ohmic contact layer 105, and the drain electrode 107, and then depositing a data pad electrode 182 on the drain electrode 107.

In the same way as the gate pad 170, the opening 108b having the elevation difference surface 108a is formed in the passivation layer 108 by opening the data pad 180.

In these areas, the opening 108b having the elevation difference surface 108a is formed in the passivation layer 108. A concavo-convex pattern 108c is formed along the elevation difference surface 108a of the opening 108b.

The passivation layer 108 may be formed of photoacryl and benzocyclobutene (BCB) as an organic film, or $SiO_x$ and $SiN_x$ as an inorganic film.

The opening 108b has an elevation difference of about 2.0-2.3 μm.

The concavo-convex pattern 108c has a shape in which a plurality of semicircles is formed successively. The opening 108b has a larger surface area than a related art opening having straight-line shaped patterns. Accordingly, when a photoresist is coated in a subsequent photolithography process, the photoresist is smoothly dispersed without aggregation and popping of the photoresist.

In other words, the photoresist dropping on the opening 108b of the passivation layer 108 flows along the surface of the opening 108b, and then is dispersed by the concavo-convex pattern 108c. Accordingly, the photoresist is evenly coated on the entire surface of the substrate 101 as well as the opening 108b.

The photoresist is coated through a spin coating process. Therefore, dispersion stains can be prevented without a separate device.

The opening 108b and the concavo-convex pattern 108c are formed by patterning a predetermined portion using a separate mask. The kind of the mask used depends on a shape of the concavo-convex pattern 108c.

The opening 108b may be formed using a dry method or a wet method. In the wet method, the opening 108b is formed by dipping a formation area of the opening 108b into an etchant and then removing the passivation layer 108.

In the dry method, the opening 108b is formed by selectively scanning the substrate 101 using beam type or bar type atmosphere plasma (AP) and then removing the passivation layer 108.

Figure 3:
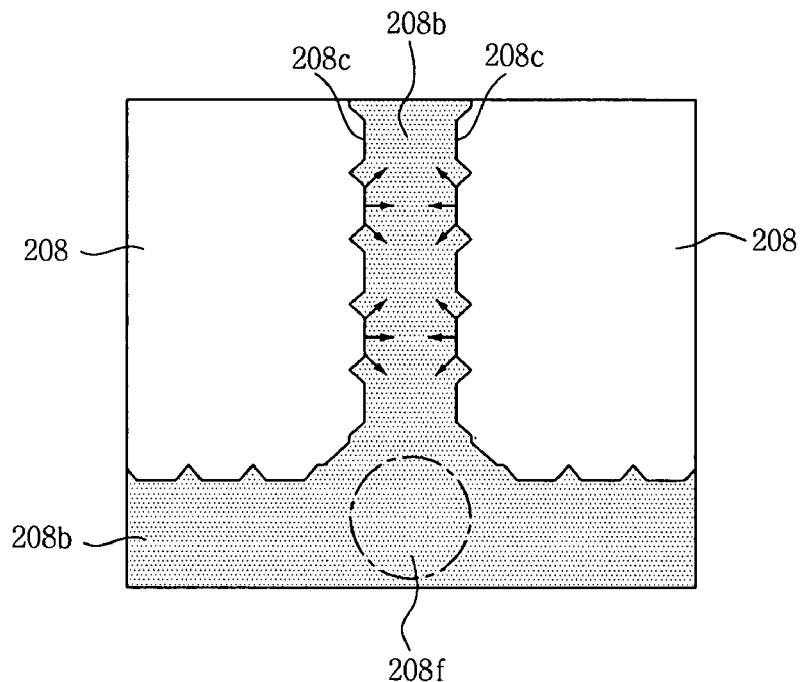
FIGS. 3 to 5 illustrate various pattern structures of a passivation layer in a liquid crystal display according to an embodiment.
Figure 4:
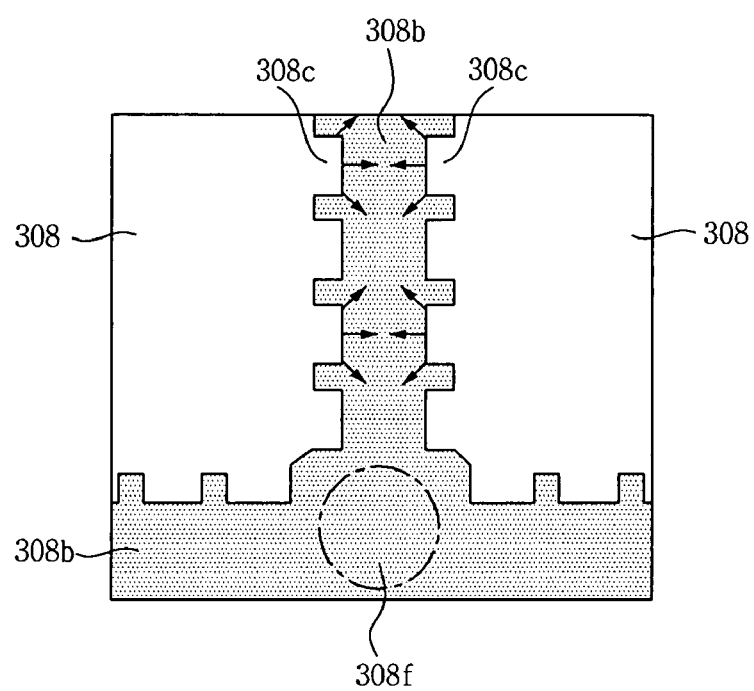
Figure 5:
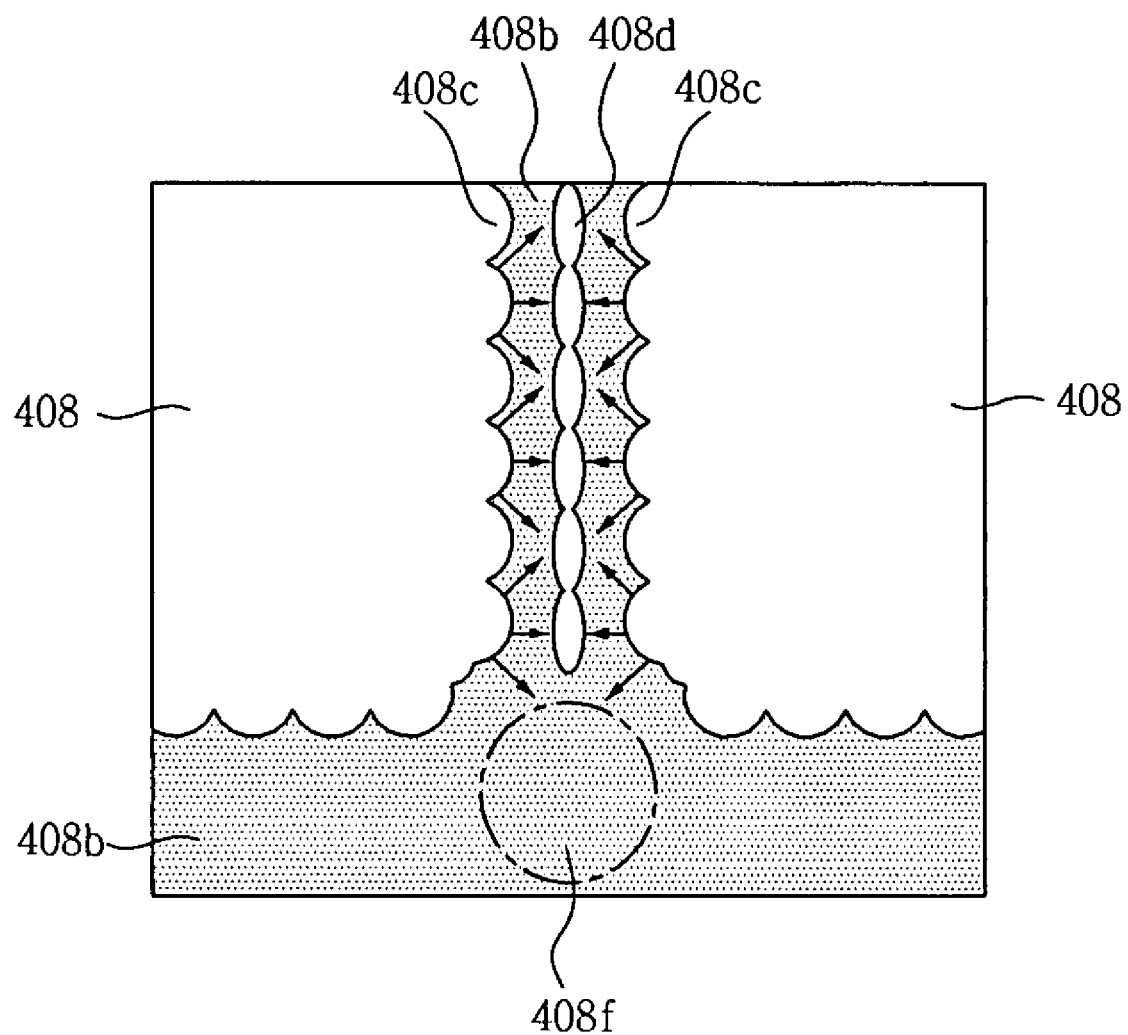

FIGS. 3 to 5 illustrate various pattern structures of a passivation layer in a liquid crystal display according to an embodiment.

Referring to FIG. 3, a passivation layer 208 includes an opening 208b having an elevation difference surface on a predetermined portion thereof. Trapezoid-shaped concavo-convex patterns 208c are formed along the elevation difference surfaces of the opening 208b.

Referring to FIG. 4, a passivation layer 308 includes an opening 308b having an elevation difference surface on a predetermined portion thereof. Rectangular-shaped concavo-convex patterns 308c are formed along the elevation difference surfaces of the opening 308b.

The predetermined portion of FIGS. 3 and 4 means a portion having stain occurrence possibility. Examples of the predetermined portion include the formation portion of the sealant used to assemble the array substrate and the color filter substrate, the formation portion of the thin film transistor used as a switching device, the formation portion of the plurality of gate pads, and the formation portion of the plurality of data pads.

The passivation layers 208 and 308 may be formed of photoacryl and benzocyclobutene (BCB) as an organic film, or $SiO_x$ and $SiN_x$ as an inorganic film. The openings 208b and 308b each have an elevation difference of about 2.0-2.3 μm.

Triangle-shaped or sawtooth-shaped concavo-convex patterns may be provided in addition to the trapezoid-shaped and rectangular-shaped concavo-convex patterns 208c and 308c. A shape of the concavo-convex patterns may be changed variously as long as the surface areas of the openings 208b and 308b increase and the photoresist is smoothly dispersed.

Referring to FIG. 5, a passivation layer 408 includes an opening 408b having an elevation difference surface on a predetermined portion thereof. Semicircle-shaped concavo-convex patterns 408c are formed along the elevation difference surfaces of the opening 408b. An island-shaped barrier 408d is formed in the center of the opening 408b.

The barrier 408d reduces the width of the opening 408b, but increases the surface area of the opening 408b so as to evenly disperse the photoresist. Therefore, a flow amount of the photoresist decreases. This results in a sufficient reduction in the occurrence of dispersion stains.

As described above, the concavo-convex patterns 408c may have various shapes in addition to the semicircle-shape. Similar to the concavo-convex patterns 408c of the opening 408b, elevation difference surfaces of the barriers 408d may have various shapes such as semicircle, trapezoid, rectangular, triangle, sawtooth shapes.

In the passivation layers 208, 308 and 408 of FIGS. 3 to 5, because flow directions of the photoresist meet each other at edges 208f, 308f and 408f of the openings 208b, 308b and 408b at which vertical lines and horizontal lines overlap, aggregation of the photoresist and the dispersion stains may frequently occur. However, the flow amount of the photoresist is reduced at the openings 208b, 308b and 408b including the edges 208f, 308f and 408f due to the concavo-convex patterns 208c, 308c and 408c, thereby effectively preventing the dispersion stains.

Figure 6:
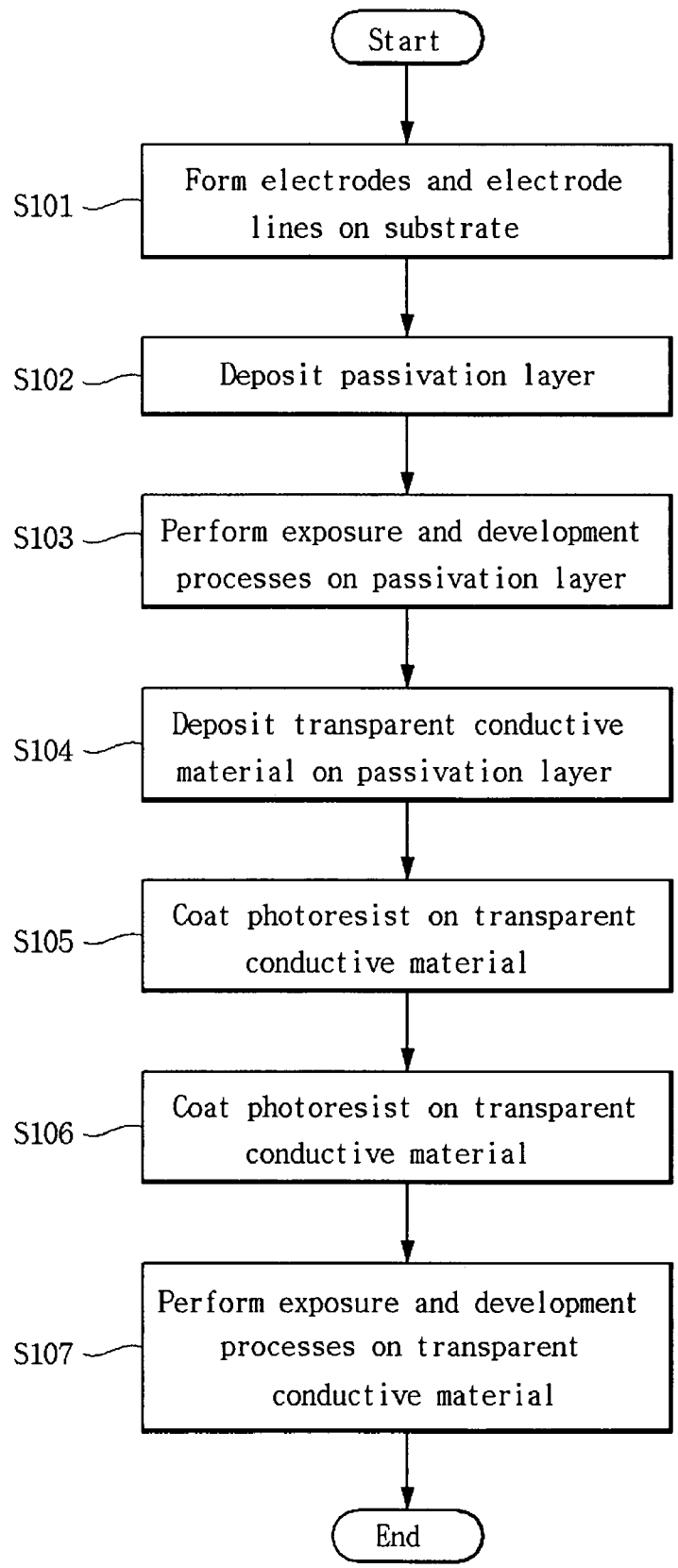
FIG. 6 is a flow chart of a method of manufacturing a liquid crystal display according to an embodiment.

FIG. 6 is a flow chart of a method of manufacturing a liquid crystal display according to an embodiment.

As illustrated in FIG. 6, in step S101, a plurality of electrodes and a plurality of electrode lines are formed on a lower substrate to form a thin film transistor in a matrix form.

Referring again to FIGS. 1 and 2, the plurality of gate lines GL are formed in parallel on the substrate 101 with a predetermined distance therebetween. The plurality of gate electrodes 102 divided from the gate lines GL and the plurality of gate pads 170 protruded from the gate lines GL are formed on the lower substrate 101.

The common lines 120 are arranged in parallel to the gate lines GL. The plurality of data lines DL are arranged in a direction perpendicular to the gate lines GL and cross the gate lines GL to define the pixel areas PXL.

The data pads 180 protruded from data lines DL are formed on the lower substrate 101.

The thin film transistor is formed at each of the intersections of the gate lines GL and the data lines DL. The thin film transistor includes the gate electrode 102, the gate insulating layer 103, the active layer 104, the ohmic contact layer 105, the source electrode 106, and the drain electrode 107.

In step S102, the passivation layer 108 is deposited on the entire surface of the lower substrate 101. In step S103, exposure and development processes are performed on the passivation layer 108 to form the opening 108b and the concavo-convex patterns 108c using a separate mask.

Hence, the passivation layer 108 includes the opening 108b having the elevation difference surface 108a. The concavo-convex patterns 108c of semicircle, trapezoid, rectangular, or triangle shape are formed along the elevation difference surface 108a.

Furthermore, an island-shaped barrier may be formed in the center of the opening 108b.

A kind of the mask used depends on a shape of the concavo-convex pattern 108c as well as the elevation difference surface of the barrier.

The opening 108b has the elevation difference of about 2.0-2.3 μm. The opening formation portion is a portion having stain occurrence possibility.

Examples of the opening formation portion include the contact area of the pixel line 110 and the drain electrode 107, the formation portion of the sealant 132 used to assemble the array substrate 100 and the color filter substrate, the formation portion of the gate pads connected to the gate lines GL and a gate driving circuit, and the formation portion of the data pads connected to the data lines DL and a data driving circuit.

In step S104, a transparent conductive material (for example, indium-tin-oxide (ITO)) is deposited on the passivation layer 108.

The transparent conductive material is used to form the pixel electrode 112, the gate pad upper electrode 172, and the data pad upper electrode 182.

In step S105, the photoresist is coated on the transparent conductive material along the shape of the passivation layer 108. In step S106, the photoresist is coated on the entire surface of the substrate 101 trough a spin coating process.

The spin coating process is performed by coating the photoresist on the substrate 101 and then rotating the substrate 101. In the spin coating process, the photoresist is dispersed from the center to the edge of the substrate 101 due to centrifugal force generated by the rotation of the substrate 101, and coated on the entire surface of the substrate 101 in a thin film form.

The photoresist dropping on the opening 108b flows along the surface of the opening 108b through the spin coating process, and is dispersed by the concavo-convex pattern 108c, thereby being evenly coated on the entire surface of the substrate 101 as well as the opening 108b.

Accordingly, the aggregation and the popping of the photoresist on the elevation difference surface 108a is prevented, thereby preventing the dispersion stain.

In step S107, exposure and development processes are performed on the transparent conductive material using the photoresist as a mask to form the pixel electrode 112 in the pixel area PXL.

In the IPS mode liquid crystal display, the pixel electrodes 112 and the common electrodes 122 are alternately formed in the pixel area PXL.

The liquid crystal display thus manufactured can prevent the dispersion stains, which will appear in the photolithography process using the spin coating method, by changing the structure of the passivation layer 108 deposited on the entire surface of the substrate 101. Accordingly, the dispersion stains can be prevented without a separate device.

Although the explanation was given of an example of the IPS mode liquid crystal display in an embodiment, the present invention may be applied to liquid crystal displays of various modes such as a twist nematic (TN) mode, a fringe field switching (FFS) mode and a vertical alignment (VA) mode.

The liquid crystal display according to an embodiment prevents the dispersion stains without a separate device, and increases a luminance by reducing the CD variation between the electrodes.

It will be apparent to those skilled in the art that various modifications and variations can be made in the liquid crystal display device and array substrate for the same of the present invention without departing from the spirit or scope of the invention. Thus, it is intended that the present invention covers the modifications and variations of this invention provided they come within the scope of the appended claims and their equivalents.

What is claimed is:

1. A liquid crystal display comprising:
   upper and lower substrates that face each other;
   a thin film transistor disposed at an intersection of a gate line and a data line on the lower substrate, the gate line and the data line crossing at right angles;
   a pixel electrode disposed in a pixel area defined by the gate line and the data line; and
   a passivation layer that covers the entire surface of the lower substrate and includes an opening that has an elevation difference surface on a predetermined portion thereof, a concave-convex pattern disposed along the elevation difference surface of the opening.

2. The liquid crystal display of claim 1, wherein the concave-convex pattern has one of semicircle, trapezoid, rectangular, and triangle shapes.

3. The liquid crystal display of claim 1, further comprising a barrier in the center of the opening.

4. The liquid crystal display of claim 3, wherein the barrier has an elevation difference surface with one of semicircle, trapezoid, rectangular, and triangle shapes.

5. The liquid crystal display of claim 1, wherein the opening has an elevation difference of about 2.0-2.3 µm.

6. The liquid crystal display of claim 1, wherein the predetermined portion where the opening is formed is an area for the contact of the thin film transistor and the pixel electrode.

7. The liquid crystal display of claim 1, wherein the predetermined portion where the opening is formed is a formation area of a sealant used to assemble the upper substrate and the upper substrate.

8. The liquid crystal display of claim 1, wherein the predetermined portion where the opening is formed is a gate pad area connected to the gate line and a gate driving circuit.

9. The liquid crystal display of claim 1, wherein the predetermined portion where the opening is formed is a data pad area connected to the data line and a data driving circuit.

10. The liquid crystal display of claim 1, wherein the thin film transistor comprises a gate electrode divided from the gate line,
a gate insulating layer disposed on a front surface that includes the gate electrode,
a semiconductor layer disposed on an upper portion of the gate insulating layer corresponding to the gate electrode, and
a source electrode and a drain electrode that are spaced apart from each other with the semiconductor layer therebetween.

11. A method of manufacturing a liquid crystal display comprising:
   forming a gate line and a data line on a lower substrate so that the gate line and the data line cross each other, and forming a thin film transistor at an intersection of the gate line and the data line;
   depositing a passivation layer substantially on the entire surface of the thin film transistor; and
   patterning the passivation layer to form an opening that has an elevation difference surface on a predetermined portion of the passivation layer and to form a concave-convex pattern along the elevation difference surface of the opening.

12. The method of claim 11, after forming the concave-convex pattern, further comprising
   depositing a pixel electrode on the passivation layer;
   coating photoresist on the pixel electrode; and
   patterning the pixel electrode using the photoresist as a mask to form the pixel electrode in a pixel area.

13. The method of claim 11, wherein the opening has an elevation difference of about 2.0-2.3 µm.

14. The method of claim 11, wherein the concave-convex pattern has one of semicircle, trapezoid, rectangular, and triangle shapes.

15. The method of claim 11, further comprising a barrier in the center of the opening.

16. The method of claim 11, wherein the predetermined portion where the opening is formed is an area for the contact of the thin film transistor and the pixel electrode.

17. The method of claim 11, wherein the predetermined portion where the opening is formed is a formation area of a sealant used to assemble an upper substrate and the upper substrate.

18. The method of claim 11, wherein the predetermined portion where the opening is formed is a gate pad area connected to the gate line and a gate driving circuit.

19. The method of claim 11, wherein the predetermined portion where the opening is formed is a data pad area connected to the data line and a data driving circuit.

20. The method of claim 12, wherein coating the photoresist on the pixel electrode comprises
   dropping the photoresist on the pixel electrode, and
   coating the photoresist along a pattern of the passivation layer using a spin coating method.

* * * * *